(12) United States Patent
Kumaki (10) Patent No.: US 7,454,679 B2
(45) Date of Patent: Nov. 18, 2008

(54) TEST APPARATUS, COMPUTER READABLE PROGRAM FOR TEST APPARATUS, TEST PATTERN RECORDING MEDIUM, AND METHOD FOR CONTROLLING TEST APPARATUS

(75) Inventor: Norio Kumaki, Tokyo (JP)

(73) Assignee: Advantest Corporation, Tokyo (JP)

( * ) Notice: Subject to any disclaimer, the term of this patent is extended or adjusted under 35 U.S.C. 154(b) by 693 days.

(21) Appl. No.: 10/858,463

(22) Filed: Jun. 1, 2004

(65) Prior Publication Data

US 2004/0221215 A1    Nov. 4, 2004

Related U.S. Application Data

(63) Continuation of application No. PCT/JP2004/003282, filed on Mar. 12, 2004.

(30) Foreign Application Priority Data

Mar. 14, 2003    (JP)    ............... 2003-069833

(51) Int. Cl.
*G01R 31/28* (2006.01)
*G06F 11/00* (2006.01)

(52) U.S. Cl. .................. 714/738; 714/718; 714/724

(58) Field of Classification Search .......... 714/718, 714/724, 738
See application file for complete search history.

(56) References Cited

U.S. PATENT DOCUMENTS

| | | | |
|---|---|---|---|
| 4,493,045 A | | 1/1985 | Hughes, Jr. |
| 4,875,210 A | * | 10/1989 | Russo et al. .............. 714/743 |
| 5,923,678 A | * | 7/1999 | Ishibashi ................. 714/738 |
| 6,108,806 A | * | 8/2000 | Abramovici et al. ........ 714/725 |
| 6,226,765 B1 | * | 5/2001 | Le et al. .................. 714/718 |
| 6,331,770 B1 | | 12/2001 | Sugamori |
| 6,560,756 B1 | | 5/2003 | Necoechea et al. |
| 6,661,839 B1 | * | 12/2003 | Ishida et al. ............... 375/240 |
| 6,754,868 B2 | * | 6/2004 | Bristow et al. ............. 714/744 |
| 6,922,803 B2 | * | 7/2005 | Nakao et al. ............... 714/738 |

(Continued)

FOREIGN PATENT DOCUMENTS

EP    0 909 037 A1    4/1999

(Continued)

OTHER PUBLICATIONS

European Communication pursuant to Article 96(2) EPC, for patent application No. 04 720 141.3, mailed Feb. 2, 2007, 4 pages.

(Continued)

*Primary Examiner*—Cynthia Britt
*Assistant Examiner*—Guerrier Merant
(74) *Attorney, Agent, or Firm*—Osha · Liang LLP (57) ABSTRACT

A test apparatus for testing a device under test includes a plurality of conversion processing units for converting split patterns recorded respectively on different split pattern recording sections in parallel, and a test pattern generating unit for providing a test pattern converted by the plurality of conversion processing units to the device under test, wherein a test pattern file used for testing the device under test includes a plurality of the split pattern recording sections where a plurality of the split patterns are recorded, and the test pattern for testing the device under test is split into the split patterns.

7 Claims, 5 Drawing Sheets

U.S. PATENT DOCUMENTS

| | | | |
|---|---|---|---|
| 2001/0054131 A1* | 12/2001 | Alvarez et al. | 711/105 |
| 2002/0101367 A1* | 8/2002 | Geiger et al. | 341/51 |
| 2002/0104049 A1* | 8/2002 | Park et al. | 714/719 |
| 2002/0184579 A1* | 12/2002 | Alvarez et al. | 714/719 |
| 2003/0005381 A1* | 1/2003 | Bristow et al. | 714/738 |
| 2003/0025519 A1* | 2/2003 | Hsieh | 324/765 |
| 2003/0061457 A1* | 3/2003 | Geiger et al. | 711/165 |
| 2004/0064771 A1* | 4/2004 | Appinger et al. | 714/733 |
| 2007/0011530 A1* | 1/2007 | Rajski et al. | 714/728 |

FOREIGN PATENT DOCUMENTS

| | | |
|---|---|---|
| JP | 59-92367 | 5/1984 |
| JP | 61-274280 | 12/1986 |
| JP | 4-161869 | 6/1992 |
| JP | 9-46629 | 2/1997 |
| JP | 9-298559 | 11/1997 |
| JP | 10-68760 | 3/1998 |
| WO | WO 98/43359 | 10/1998 |
| WO | WO 2004/081593 A1 | 9/2004 |

OTHER PUBLICATIONS

European Search Report dated Mar. 2, 2006 (3 pages).
International Search Report dated Mar. 2, 2006 (3 pages).
International Search Report dated Jul. 13, 2004 (2 pages).
Patent Abstracts of Japan; Publication No. 09-046629 dated Feb. 14, 1997 (2 pages).
Patent Abstracts of Japan; Publication No. 59-092367 dated May 28, 1984 (2 pages).
Patent Abstracts of Japan; Publication No. 04-161869 dated Jun. 5, 1992 (2 pages).
Patent Abstracts of Japan; Publication No. 61-274280 dated Dec. 4, 1986 (2 pages).
Patent Abstracts of Japan; Publication No. 09-298559 dated Nov. 18, 1997 (2 pages).
Patent Abstracts of Japan; Publication No. 10-068760 dated Mar. 10, 1998 (2 pages).

* cited by examiner

TEST APPARATUS, COMPUTER READABLE PROGRAM FOR TEST APPARATUS, TEST PATTERN RECORDING MEDIUM, AND METHOD FOR CONTROLLING TEST APPARATUS

The present application is a continuation application of PCT/JP2004/003282 filed on Mar. 12, 2004 which claims priority from a Japanese patent application No. 2003-069833 filed on Mar. 14, 2003, the contents of which are incorporated herein by reference.

BACKGROUND OF THE INVENTION

1. Field of the Invention

The present invention relates to a test apparatus, a computer readable program for a test apparatus, a test pattern recording medium, and a method for controlling a test apparatus. More particularly, the present invention relates to a test apparatus, a computer readable program for a test apparatus, a test pattern recording medium, and a method for controlling a test apparatus, capable of supplying a test pattern used for a test of a device under test to a test pattern generating unit for performing the test of the device under test highly accurately.

2. Description of the Related Art

A conventional test apparatus for testing the device under test generally uses a method by which a controlling processor of the test apparatus obtains and supplies a test pattern file used for the test of the device under test to the test pattern generating unit.

As a semiconductor device is recently largely integrated, the test pattern file becomes large in size. And as the test pattern file becomes large in size, the time required for the controlling processor to obtain and supply the test pattern file to the test pattern generating unit increases, and that becomes an obstacle to perform the test of the semiconductor device at high speed.

SUMMARY OF THE INVENTION

Therefore, it is an object of the present invention to provide a test apparatus, a computer readable program for a test apparatus, a test pattern recording medium, and a method for controlling a test apparatus, which is capable of overcoming the above drawbacks accompanying the conventional art. The above and other objects can be achieved by combinations described in the independent claims. The dependent claims define further advantageous and exemplary combinations of the present invention.

According to the first aspect of the present invention, a test apparatus for testing a device under test includes a plurality of conversion processing units for converting split patterns recorded respectively on different split pattern recording sections in parallel, and a test pattern generating unit for providing a test pattern converted by the plurality of conversion processing units to the device under test, wherein a test pattern file used for testing the device under test includes a plurality of the split pattern recording sections where a plurality of the split patterns are recorded, and the test pattern for testing the device under test is split into the split patterns.

The plurality of split patterns may be compressed to be recorded on the plurality of split pattern recording sections, and the plurality of conversion processing units may decompress and convert the compressed split patterns respectively recorded on the different split pattern recording sections in parallel.

The test apparatus may further include a split pattern supplying unit for storing test pattern data included in the split pattern decompressed by the plurality of conversion processing unit on a location indicated by a test pattern address corresponding to the test pattern data in the test pattern generating unit, wherein each of the plurality of decompressed split patterns may include test pattern data provided to the test pattern generating unit and the test pattern address indicating an address where the test pattern data is stored in the test pattern generating unit.

The test apparatus may further include one or more of additional test pattern generating units, wherein each of the plurality of decompressed split patterns may further include test pattern generating unit identifying information which indicates one out of the test pattern generating units for storing the test pattern data, and the split pattern generating unit may store the test pattern data included in the split pattern decompressed by the plurality of conversion processing units on a location indicated by the test pattern address in one of the test pattern generating units indicated by test pattern generating unit identifying information corresponding to the test pattern data.

The test apparatus may further include a relaying unit for relaying communication between a storage for storing the test pattern file and the plurality of conversion processing units, wherein communication throughput of each of a plurality of communication links provided between the relaying unit and the plurality of conversion processing units may be lower than that of a communication link provided between the storage and the relaying unit.

The test pattern file may further include a storage location recording section where storage location of each of the plurality of split patterns is recorded, one of the conversion processing units may include a storage location selecting unit for selecting a storage location of the split pattern which will be decompressed by other one of the conversion processing units according to the storage location recording section, and the other one of the conversion processing units may decompress the split pattern recorded on the storage location in the test pattern file selected by the storage location selecting unit.

According to the second aspect of the present invention, a recording medium where a test pattern used for testing a device under test includes a plurality of compressed pattern recording sections where a plurality of compressed split patterns are recorded, wherein the test pattern for testing the device under test is split into a plurality of split patterns, a storage location recording section where storage location of each of the plurality of split patterns in a test pattern file is recorded.

Each of the plurality of split patterns may include test pattern data provided to a test pattern generating unit and a test pattern address indicating an address where the test pattern data is stored in the test pattern generating unit.

According to the third aspect of the present invention, a computer readable program used by a test apparatus for testing a device under test includes a test pattern file used for testing the device under test including a plurality of split pattern recording sections where a plurality of split patterns are recorded, wherein a test pattern for testing the device under test is split into the plurality of split patterns, and a storage location recording section where storage location of each of the plurality of split patterns is recorded, wherein the computer readable program makes the test apparatus perform as a storage location selecting unit for selecting a plurality of storage locations of the split patterns respectively recorded on the different split pattern recording sections according to the storage location recording section, and a plurality of conversion processing units for converting in parallel the split pattern recorded on the storage location selected by the storage location selecting unit in the test pattern file.

According to the fourth aspect of the present invention, a method for controlling a test apparatus, which tests a device under test, includes a converting step for converting split patterns recorded respectively on different split pattern recording sections in parallel, and a test pattern generating step for providing a converted test pattern to the device under test, wherein a test pattern file used for testing the device under test includes a plurality of the split pattern recording sections where a plurality of the split patterns are recorded, and the test pattern for testing the device under test is split into the split patterns.

The summary of the invention does not necessarily describe all necessary features of the present invention. The present invention may also be a sub-combination of the features described above. The above and other features and advantages of the present invention will become more apparent from the following description of the embodiments taken in conjunction with the accompanying drawings.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
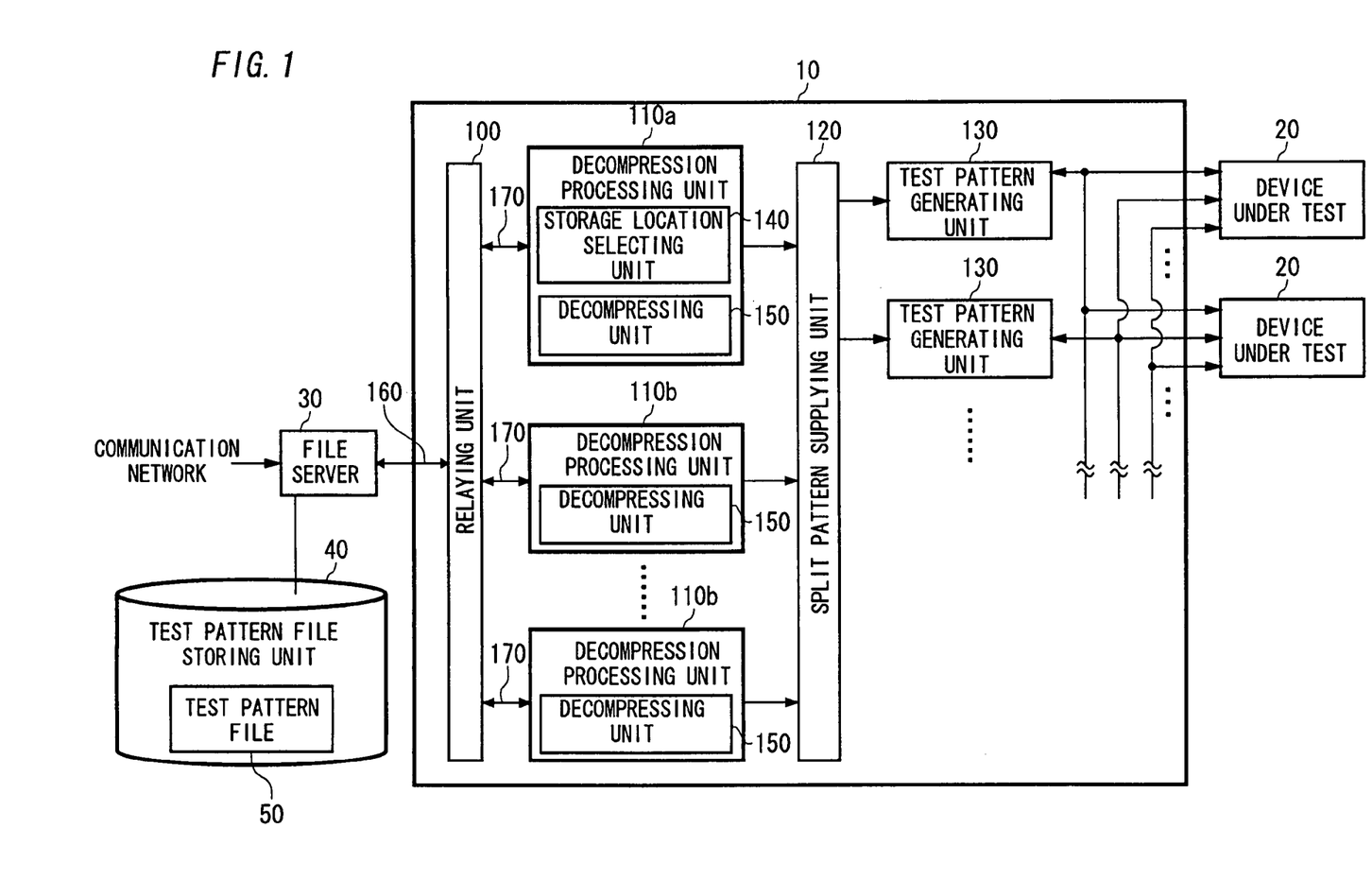
FIG. 1 shows the configuration of a test apparatus 10 according to an exemplary embodiment of the present invention.

FIG. 1 shows the configuration of a test apparatus 10 of this embodiment. The test apparatus 10 is coupled to devices under test 20 and a file server 30, and performs the test of at least one of the devices under test 20 using a test pattern file 50 stored in a test pattern file storing unit 40 being connected to the file server 30. It is an object of the test apparatus 10 to perform the test highly efficiently using the large test pattern file 50 in size by splitting the test pattern file 50 and performing a conversion in parallel. The test apparatus 10 in this embodiment, as an example of the "conversion", splits the compressed test pattern file 50 and then "decompresses" it in parallel.

The device under test 20 is a semiconductor device to be an object under the test by the test apparatus 10. The file server 30 is connected to a communication network, and supplies the test pattern file 50 to the test apparatus 10. The test pattern file storing unit 40 is connected to the file server 30, and stores the test pattern file 50. The test pattern file storing unit 40 in this embodiment is an example of the test pattern recording medium. The test pattern file 50 is a file used for the test of the device under test 20. The test pattern file 50 includes a plurality of compression pattern recording sections in which each of a plurality of split patterns resulting from splitting a test pattern for the test of the device under test 20 is compressed and recorded independently, and a storage location recording section in which the storage location of each of the split patterns in the test pattern file 50 is recorded. The compression pattern recording sections are an example of the split pattern recording sections in this embodiment in which a plurality of split patterns are recorded.

The test pattern file 50 may be stored in an external recording medium, or be provided to the test pattern file storing unit 40 through the communication network, where a storage device such as a hard disc or RAM provided in a server system connected to the communication network or Internet is used as the recording medium.

The test apparatus 10 includes a relaying unit 100, a plurality of decompression processing units 110a and 110b, a split pattern supplying unit 120, and at least one test pattern generating unit 130. The relaying unit 100 relays communications between the test pattern file storing unit 40 which is a storage device for storing the test pattern files and the decompression processing units 110a and 110b. The decompression processing units 110 decompress in parallel the compressed split patterns recorded respectively in different compression pattern recording sections. The decompression processing units 110 is an example of a plurality of conversion processing unit of this invention for converting in parallel the split patterns recorded respectively in different split pattern recording sections.

Each of the decompression processing units 110 includes a decompression processing unit 110a for controlling the entire decompression process and performing a decompression process on the split patterns, and a decompression processing unit 110b for performing a decompression process on the split patterns based on an instruction of the decompression processing unit 110a. The decompression processing unit 110a includes a storage location selecting unit 140 for selecting the storage location of the split patterns to be decompressed by the decompression processing unit 110 with regard to the decompression processing unit 110a itself and/or each of the decompression processing units 110b based on the storage location recording section, and a decompressing unit 150 for decompressing the split patterns recorded in the storage location selected by the storage location selecting unit 140. Each of the decompression processing units 110a and 110b of this embodiment may use a dedicated decompressing processor or alternatively a general processor.

The split pattern supplying unit 120 supplies the split patterns decompressed by the decompression processing units 110 to the corresponding test pattern generating unit 130. The test pattern generating unit 130 supplies the test pattern decompressed by the decompression processing units 110 and supplied via the split pattern supplying unit 120 to the device under test 20. If a plurality of the test pattern generating units 130 is provided in the test apparatus 10, the test pattern generating units 130 may supply the test pattern in response to each part of the terminals of the device under test 20 or alternatively the test pattern in response to the devices under test 20, which are different from each other. The test pattern generating unit 130 of this embodiment includes a storage section for storing the test pattern data constituting the test pattern in response to each address determined by the decompression processing unit 110.

As described above, the decompression processing units 110a and 10b decompress the test pattern file 50 for each part thereof. Accordingly, the amount of the split pattern data obtained by each of the decompression processing units 110 via internal communication links 170 connected to the decompression processing units 110 is small as compared to the amount of the entire data of the test pattern file 50. Therefore, each of the internal communication links 170 provided between the relaying unit 100 and the decompression processing units 110 may have its communication throughput which is small as compared to an external communication link 160 provided between the file server 30 for storing the test pattern file 50 and the relaying unit 100. In other words, if eight decompression processing units 110 are provided, each of the internal communication links 170 may be a 100M Ethernet (Registered Trade Mark) whereas the external communication link 160 may be a 1G Ethernet (Registered Trade Mark).

Figure 2:
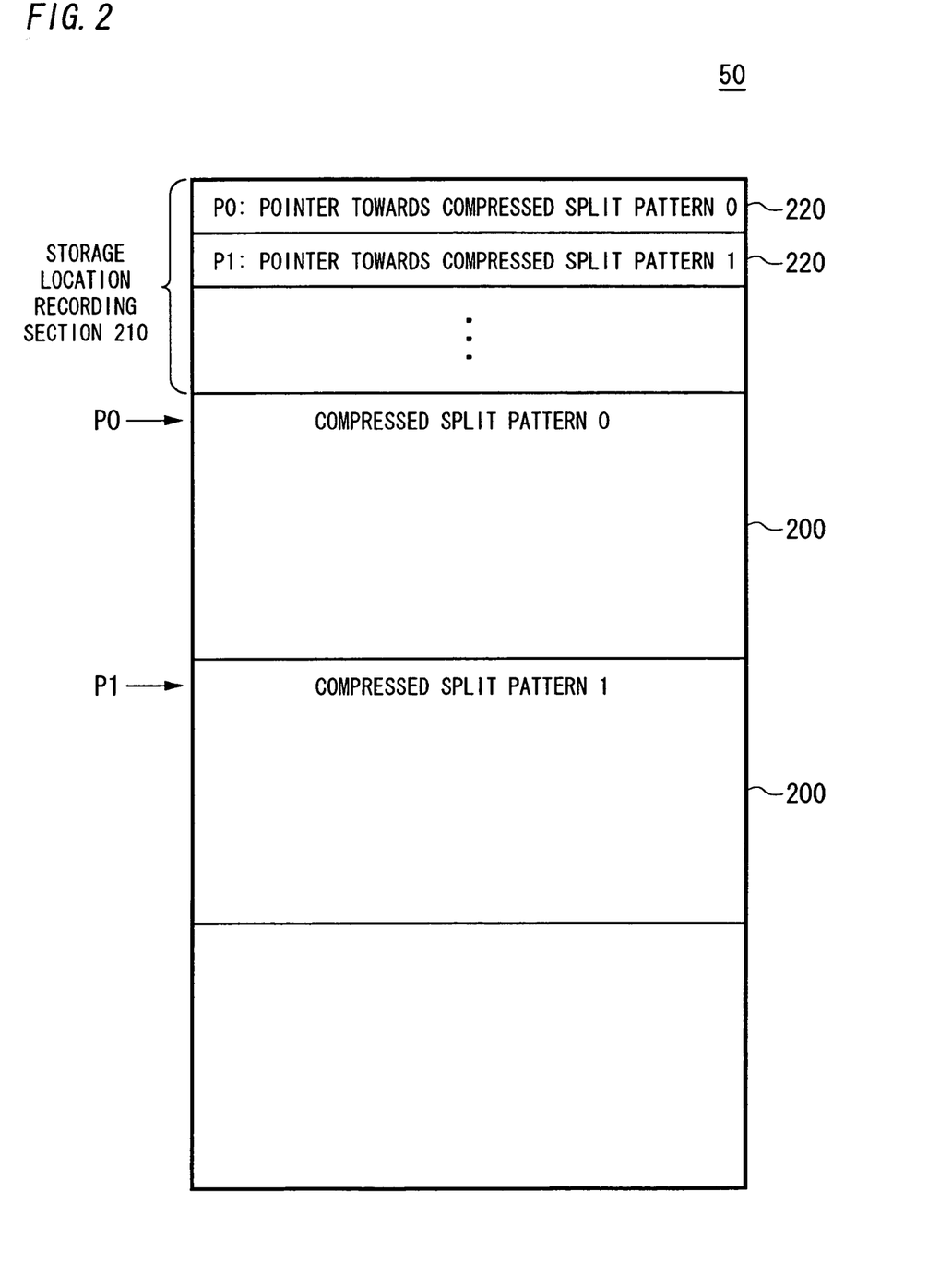
FIG. 2 shows a file configuration of a test pattern file 50 according to an exemplary embodiment of the present invention.

FIG. 2 shows the file configuration of the test pattern file 50 of this embodiment. The test pattern file 50 includes a plurality of compression pattern recording sections 200 and a storage location recording section 210. Each of the compression pattern recording sections 200 is an example of the split pattern recording section of the present invention, where the split patterns resulting from splitting the test pattern for the test of the device under test 20 are compressed and recorded. In the storage location recording section 210, a plurality of split pattern pointers 220 as an example of the information indicating the storage location of the test pattern file 50 for each of the split patterns are recorded.

As above, the split patterns each of which is stored in the compression pattern recording section 200 may be compressed by way of a compression algorithm such as ALDC or DCLZ, the split patterns being independent to each other. Accordingly, each of the decompression processing units 110 obtains the split patterns recorded in the compression pattern recording sections 200 indicated by the split pattern pointers 220 from the test pattern file 50, and thereby can decompress the split patterns independently without obtaining other split patterns.

Figure 3:
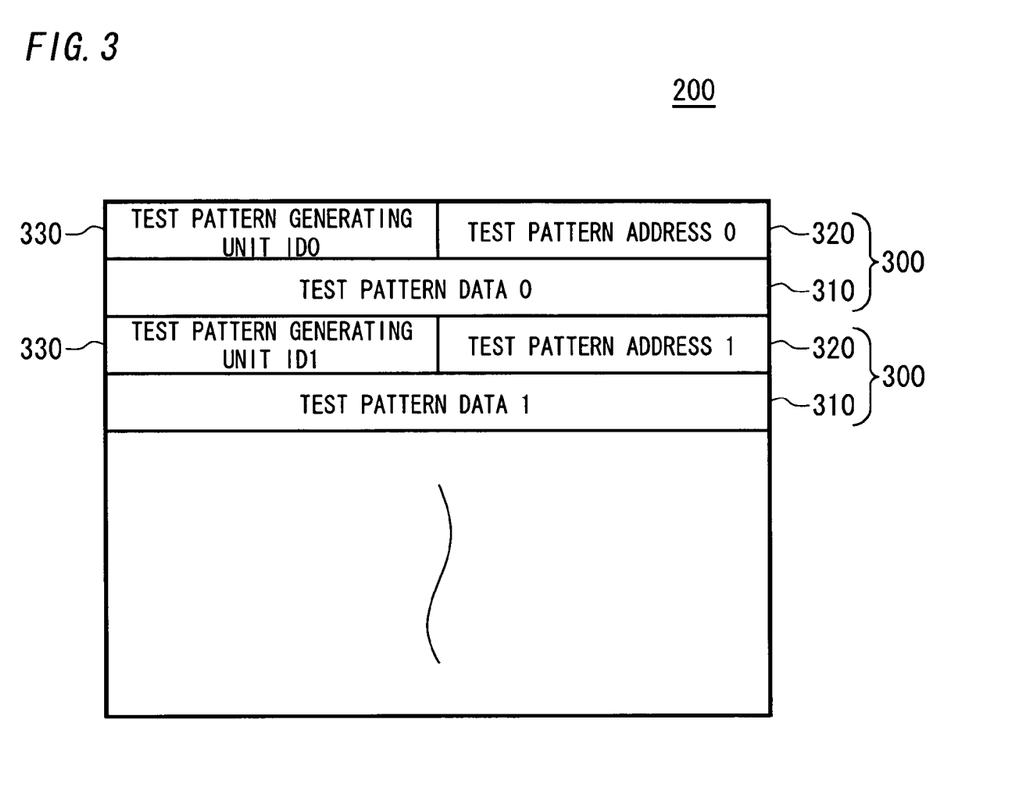
FIG. 3 shows the data configuration of a compression pattern recording section 200 according to an exemplary embodiment of the present invention.

FIG. 3 shows the data configuration of the compression pattern recording sections 200 of this embodiment. Each of the compression pattern recording section 200 contains a plurality of pattern elements 300 including test pattern data 310, a test pattern address 320, and a test pattern generating unit ID 330. The test pattern data 310 constitutes the test pattern to be supplied to the test pattern generating unit 130. The test pattern address 320 shows an address in the test pattern generating unit 130 at which the corresponding test pattern data 310 should be stored. The test pattern generating unit ID 330 indicates one of the test pattern generating units 130 to store the corresponding test pattern data 310.

Figure 4:
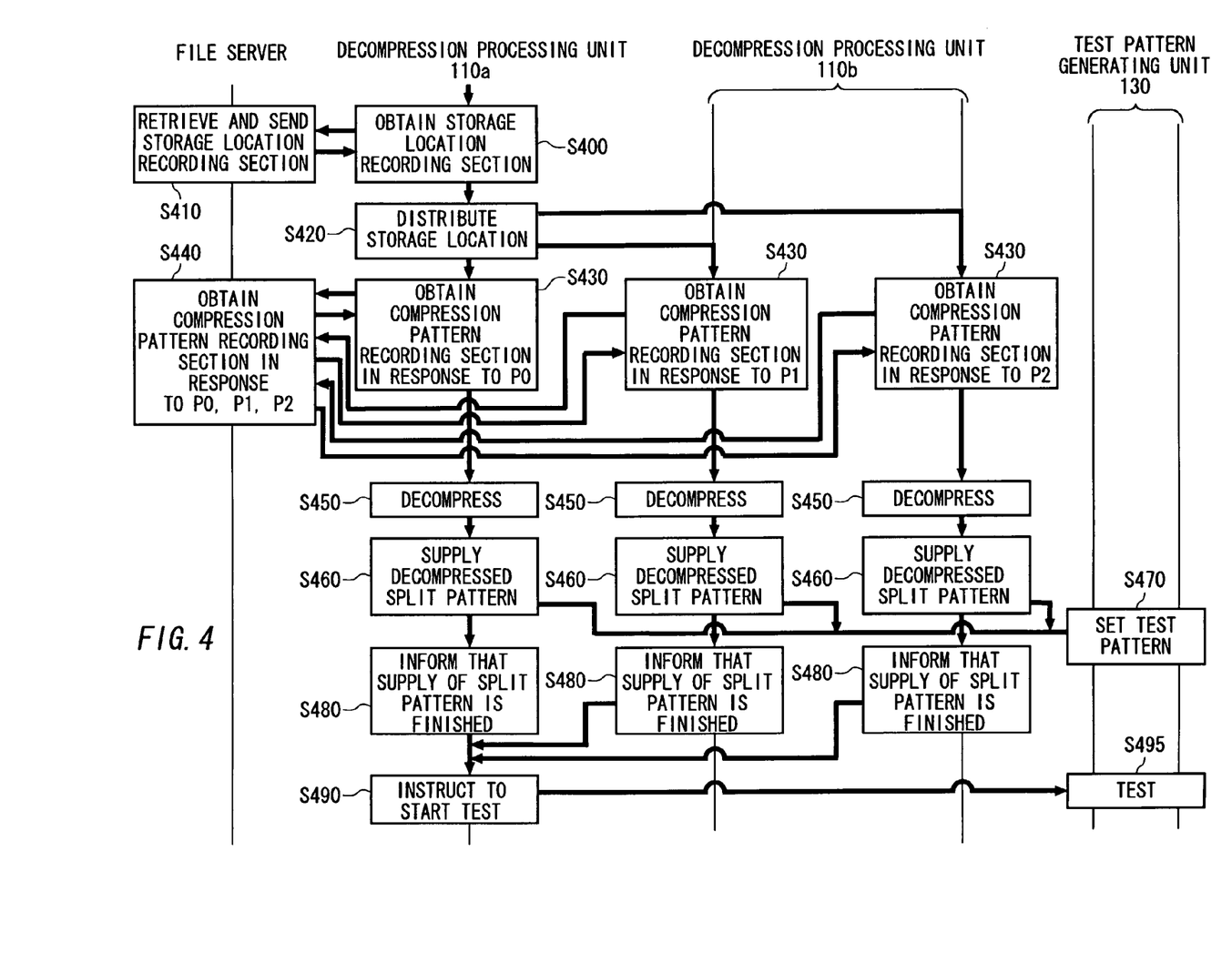
FIG. 4 shows a process of a test apparatus 10 according to an exemplary embodiment of the present invention.

FIG. 4 shows a process of the test apparatus 10 in this embodiment. First, the decompression processing unit 110a for controlling the entire decompression process among the decompression processing units 110 requires the file server 30 to retrieve the storage location recording section 210 of the test pattern file 50 (S400). The file server 30 receives the request of the decompression processing unit 110a, retrieves the storage location recording section 210 of the test pattern file 50 from the test pattern file storing unit 40, and sends it to the decompression processing unit 110a via the relaying unit 100 (S410). In this case, the decompression processing unit 110a obtains the storage location recording section 210 of the test pattern file 50.

Then, the storage location selecting unit 140 inside the decompression processing unit 110a selects the storage location of the split patterns to be decompressed by the decompression processing units 110a and 110b based on the storage location of each split pattern indicated by the split pattern pointers 220 in the storage location recording section 210, and sends the selected storage location to the decompression processing unit 110 (S420). Here, the storage location selecting unit 140 may select any of decompression processing units 110 to decompress the split patterns in response to the split pattern pointers 220 in the storage location recording section 210 based on a predetermined algorithm. Particularly, the storage location selecting unit 140 may set the decompression processing unit 110a to decompress the split pattern 0 in response to a first split pattern pointer 220 (P0), a first decompression processing unit 110b to decompress the split pattern 1 in response to a second split pattern pointer 220 (P1), in the same way, a (n−1) th decompression processing unit 110b to decompress the split pattern n in response to a nth split pattern pointer 220, and the decompression processing unit 110a to decompress the split pattern n+1 in response to a n+1 split pattern pointer 220. Alternatively, the storage location selecting unit 140 may dynamically assign the split patterns to be decompressed next time to the decompression processing unit 110 having finished the decompression process of the assigned split patterns.

Then, each of the decompression processing units 110 obtains the split patterns recorded in the compression pattern recording section 200 assigned to the storage location of the test pattern file 50 selected by the storage location selecting unit 140 via the file server 30 and the relaying unit 100 (S430). In response to S430, the file server 30 receives the storage location from each of the decompression processing units 110, retrieves the compression pattern recording section 200 in response to the storage location from the test pattern file 50 in the test pattern file storing unit 40, and sends the storage location to the decompression processing unit 110 (S440).

Then, each of the decompression processing units 110 decompresses the split patterns received during S430 in parallel to other decompression processing unit 110 (S450). Then, each of the decompression processing units 110 supplies the decompressed split patterns to the split pattern supplying unit 120. In other words, each of the decompression processing units 110 sends an instruction to read the test pattern data 310 to the split pattern supplying unit 120 for each of the test pattern element 300 included in the split patterns, where the test pattern data 310 is located at the test pattern address 320 in the test pattern generating unit 130 designated by the test pattern generating unit ID 330.

Then, the split pattern supplying unit 120 stores the test pattern data 310 included in the split patterns decompressed by the decompression processing units 110 at an address location indicated by the test pattern address 320 in one of the test pattern generating units 130 designated by the test pattern generating unit ID 330 in response to the test pattern data 310 (S460). The test pattern generating unit 130 designated by the test pattern generating unit ID 330 stores the test pattern data 310 supplied from the split pattern supplying unit 120 at the address location indicated by the corresponding test pattern address 320, so that it sets a part of the test pattern to be processed by the test pattern generating unit 130 (S470).

When each of the decompression processing units 110 finishes supplying the split patterns decompressed by the decompression processing unit 110 to the test pattern generating unit 130, it informs the storage location selecting unit 140 of the decompression processing unit 110a that the supply of the split patterns has been finished (S480). When the notice that the supply of the split patterns has been finished is received from all of the decompression processing units 110, the storage location selecting unit 140 instructs at least one test pattern generating unit 130 to start the test via the split pattern supplying unit 120 (S490). When the test pattern generating unit 130 receives the instruction to start the test, it supplies the test pattern, which has been decompressed by the decompression processing unit 110 in S450 and set in S460 and S470, to at least one device under test 20 so as to perform the test of the device under test 20 (S495).

In S460 above, the split pattern supplying unit 120 stores each of pieces of the test pattern data 310 included in the test pattern at the address location designated by the test pattern address 320 in the test pattern generating unit 130 designated by the corresponding test pattern generating unit ID 330. Here, the split pattern supplying unit 120 only has to finish storing the entire test pattern data 310 in the designated test pattern generating unit 130 when the test starts, but not to store the test pattern data 310 in a certain sequence with regard to the test pattern file 50. Accordingly, the split pattern supplying unit 120 doesn't need to change the split patterns decompressed by the decompression processing units 110 in a certain sequence with regard to the test pattern file 50 to supply it to the test pattern generating unit 130, and thereby can supply the test pattern to the test pattern generating unit 130 highly efficiently.

Figure 5:
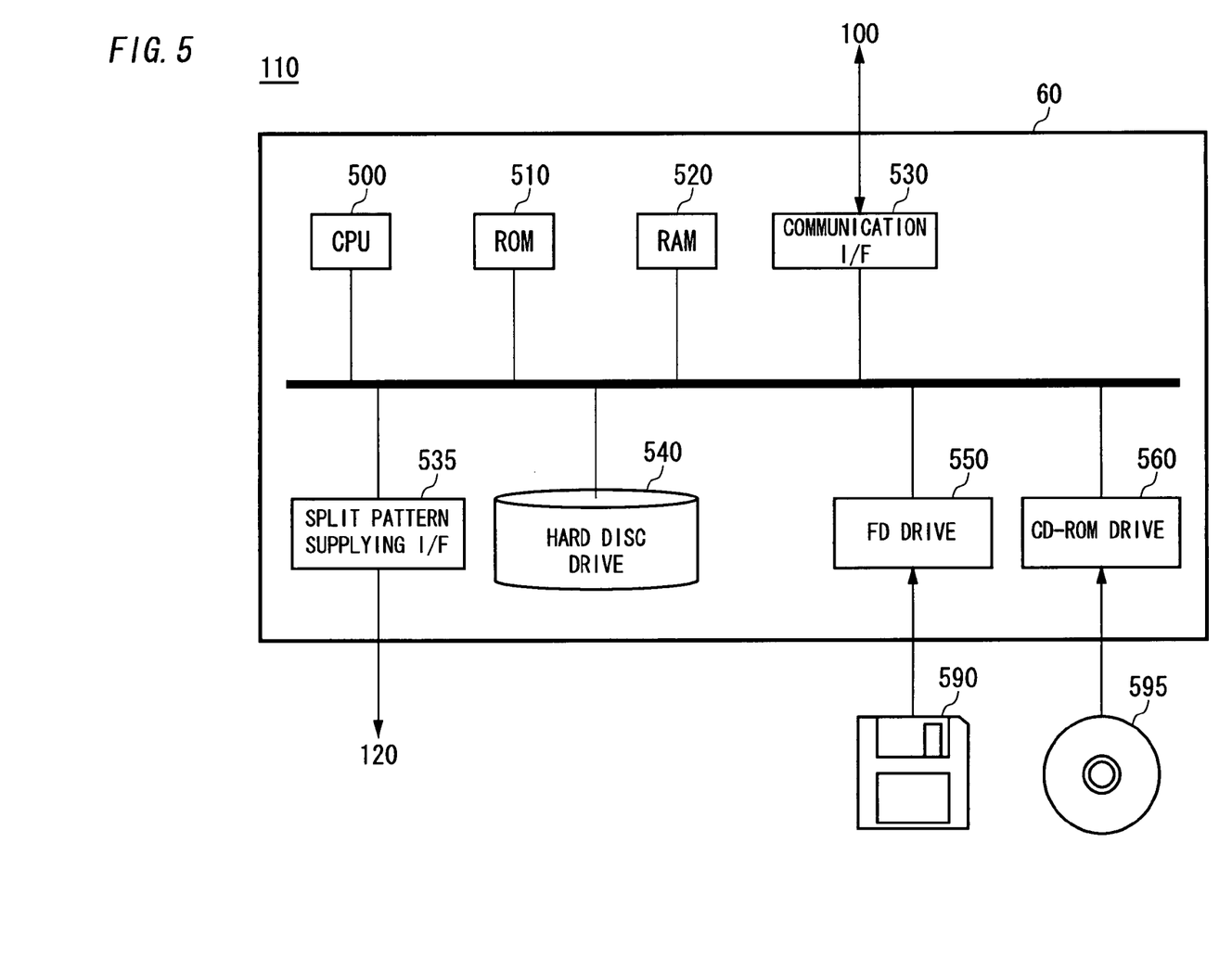
FIG. 5 shows the hardware configuration of a decompression processing unit 110 according to an exemplary embodiment of the present invention.

FIG. 5 shows the hardware configuration of the decompression processing unit 110 of this embodiment. The decompression processing unit 110 of this embodiment is realized by a computer 60 including a CPU 500, a ROM 510, a RAM 520, a communication interface 530, a split pattern supplying interface 535, a hard disc drive 540, a flexible disc drive 550, and a CD-ROM drive 560.

The CPU 500 operates based on a program stored in the ROM 510 and RAM 520, and controls each part. The ROM 510 stores a boot program for executing the CPU 500 at the time of initiating the device under test 20 or a program dependent upon the hardware of the device under test 20. The RAM 520 stores the program executed by the CPU 500 and the data used for the CPU 500. The communication interface 530 communicates with the relaying unit 100 via the internal communication links 170. The split pattern supplying interface 535 is coupled to the split pattern supplying unit 120 relays the data transmission with the split pattern supplying unit 120. The hard disc drive 540 stores the program and data used by the computer 60, and supplies it to the CPU 500 via the RAM 520. The flexible disc drive 550 reads the program or data from the flexible disc 590, and supplies it to the RAM 520. The CD-ROM drive 560 reads the program or data from the CD-ROM 595, and supplies it to the RAM 520.

The program provided to the CPU 500 via the RAM 520 is provided by a user, the program being stored in a recording medium such as the flexible disc 590, the CD-ROM 595, an IC card, etc. the program is read from the recording medium, installed in the computer 60 via the RAM 520, and executed in the computer 60.

The program installed and executed in the computer 60 includes a storage location selecting module and a decompression module. These program or modules allows the computer 60 to function as the storage location selecting unit 140 and the decompressing unit 150 respectively.

The program or modules as above may be stored in an external recording medium. As the recording medium, there might be, in addition to the flexible disc 590 and the CD-ROM 595, an optical recording medium such as a DVD or CD, an Electro-Optical recording medium such as MO disc, a tape medium, a semiconductor memory such as an IC card, etc. In addition, with a storage device, as the recording medium, such as a hard disc drive or RAM provided in a server system connected to a dedicated communication network or Internet, the program may be provided to the computer 60 from the external network via the relaying unit 100.

As obvious from the description above, according to the present invention, it is possible to test a semiconductor device at high speed by supplying a test pattern to a test pattern generating unit highly efficiently.

Although the present invention has been described by way of exemplary embodiments, it should be understood that those skilled in the art might make many changes and substitutions without departing from the spirit and the scope of the present invention which is defined only by the appended claims.

What is claimed is:

1. A test apparatus for testing a device under test comprising:
   a plurality of conversion processing units for converting split patterns recorded respectively on different split pattern recording sections in parallel; and
   a test pattern generating unit for providing a test pattern converted by said plurality of conversion processing units to said device under test,
   wherein a test pattern file used for testing said device under test comprises a plurality of said split pattern recording sections where a plurality of said split patterns are recorded, and said test pattern for testing said device under test is split into said split patterns,
   the test apparatus further comprising a split pattern supplying unit for storing test pattern data comprised in said split pattern decompressed by said plurality of conversion processing unit on a location indicated by a test pattern address corresponding to said test pattern data in said test pattern generating unit,
   wherein each of said plurality of decompressed split patterns comprises test pattern data to be provided to said test pattern generating unit and said test pattern address indicating an address where said test pattern data is stored in said test pattern generating unit.

2. The test apparatus as claimed in claim 1, wherein said plurality of split patterns are compressed to be recorded on said plurality of split pattern recording sections, and said plurality of conversion processing units decompress and convert said compressed split patterns respectively recorded on said different split pattern recording sections in parallel.

3. The test apparatus as claimed in claim 2 further comprising: a relaying unit for relaying communication between a storage for storing said test pattern file and said plurality of conversion processing units, wherein communication throughput of each of a plurality of communication links provided between said relaying unit and said plurality of conversion processing units is lower than that of a communication link provided between said storage and said relaying unit.

4. The test apparatus as claimed in claim 2, wherein said test pattern file further comprises a storage location recording section where storage location of each of said plurality of split patterns is recorded, one of said conversion processing units comprises a storage location selecting unit for selecting a storage location of said split pattern which will be decompressed by other one of said conversion processing units according to said storage location recording section, and said other one of said conversion processing units decompresses said split pattern recorded on said storage location in said test pattern file selected by said storage location selecting unit.

5. The test apparatus as claimed in claim 1 further comprising:
   one or more of additional test pattern generating units,
   wherein each of said plurality of decompressed split patterns further comprises test pattern generating unit identifying information which indicates one out of said test pattern generating units for storing said test pattern data, and wherein said split pattern supplying unit stores said test pattern data comprised in said split pattern decompressed by said plurality of conversion processing units on a location indicated by said test pattern address in one of said test pattern generating units indicated by test pattern generating unit identifying information corresponding to said test pattern data.

6. A computer readable medium containing a program instructing a test apparatus to test a device under test, the program comprising:

a test pattern file used for testing said device under test comprising:

a plurality of split pattern recording sections where a plurality of split patterns are recorded, wherein a test pattern for testing said device under test is split into said plurality of split patterns; and a storage location recording section where storage location of each of said plurality of split patterns is recorded;

wherein said program instructs said test apparatus to perform as:

a storage location selecting unit for selecting a plurality of storage locations of said split patterns respectively recorded on said different split pattern recording sections according to said storage location recording section; and a plurality of conversion processing units for converting in parallel said split pattern recorded on said storage location selected by said storage location selecting unit in said test pattern file, wherein each of the split patterns comprises test pattern data to be provided to a test pattern generating unit and a test pattern address indicating an address where the test pattern data is stored in the test pattern generating unit.

7. A method for controlling a test apparatus, which tests a device under test, a test pattern file used for testing said device under test comprising a plurality of split pattern recording sections where a plurality of split patterns are recorded, and a test pattern for testing said device under test being split into said split patterns, comprising:

a converting step for converting split patterns recorded respectively on different split pattern recording sections into said test pattern in parallel; and a test pattern generating step for providing the test pattern to said device under test, wherein each of the split patterns comprises test pattern data to be provided to a test pattern generating unit and a test pattern address indicating an address where the test pattern data is stored in the test pattern generating unit.

* * * * *